(12) United States Patent
Weber et al.

(10) Patent No.: US 7,749,930 B2
(45) Date of Patent: Jul. 6, 2010

(54) HOLDER MADE FROM QUARTZ GLASS FOR THE PROCESSING OF SEMICONDUCTOR WAFERS AND METHOD FOR PRODUCTION OF THE HOLDER

(75) Inventors: Juergen Weber, Kleinostheim (DE); Tobias Pogge, Muehlheim (DE); Martin Trommer, Schluechtern (DE); Bodo Kuehn, Gelnhausen (DE); Ulrich Kirst, Mainz (DE); Waltraud Werdecker, Hanau (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 508 days.

(21) Appl. No.: 11/630,405

(22) PCT Filed: Mar. 30, 2006

(86) PCT No.: PCT/EP2006/061192
§ 371 (c)(1),
(2), (4) Date: Dec. 21, 2006

(87) PCT Pub. No.: WO2006/108766
PCT Pub. Date: Oct. 19, 2006

(65) Prior Publication Data
US 2008/0066497 A1    Mar. 20, 2008

(30) Foreign Application Priority Data
Apr. 15, 2005    (DE) .................. 10 2005 017 739

(51) Int. Cl.
*C03C 3/06*     (2006.01)
*C03C 3/04*     (2006.01)
*C03C 15/00*    (2006.01)
*C03B 19/00*    (2006.01)
*C03B 21/00*    (2006.01)
*C03B 32/00*    (2006.01)
*C03B 25/00*    (2006.01)

(52) U.S. Cl. .................. 501/54; 501/53; 65/17.6; 65/30.1; 65/63; 65/111; 65/117

(58) Field of Classification Search .................. 501/54; 65/17.3, 17.6, 30.1, 63, 64, 111, 117
See application file for complete search history.

(56) References Cited

U.S. PATENT DOCUMENTS 4,203,744 A * 5/1980 Schultz et al. ............... 65/399

(Continued)

FOREIGN PATENT DOCUMENTS

DE    10 2005 005 196 A1    8/2006

(Continued)

OTHER PUBLICATIONS

Dodd et al., "Optical Determinations of OH in Fused Silica," 1966, p. 3911.

(Continued)

*Primary Examiner*—Karl E Group
*Assistant Examiner*—Noah S Wiese
(74) *Attorney, Agent, or Firm*—Taijoloff and Kelly LLP (57) ABSTRACT

An ideal quartz glass for a wafer jig for use in an environment having an etching effect is distinguished by both high purity and high resistance to dry etching. To indicate a quartz glass that substantially fulfills these requirements, it is suggested according to the invention that the quartz glass is doped with nitrogen at least in a near-surface area, has a mean content of metastable hydroxyl groups of less than 30 wt ppm and that its fictive temperature is below 1250° C. and its viscosity is at least $10^{13}$ dPa·s at a temperature of 1200° C. An economic method for producing such a quartz glass comprises the following method steps: melting an $SiO_2$ raw material to obtain a quartz glass blank, the $SiO_2$ raw material or the quartz glass blank being subjected to a dehydration measure, heating the $SiO_2$ raw material or the quartz glass blank to a nitriding temperature in the range between 1050° C. and 1850° C. in an ammonia-containing atmosphere, a temperature treatment by means of which the quartz glass of the quartz glass blank is set to a fictive temperature of 1250° C. or less, and a surface treatment of the quartz glass blank with formation of the quartz glass jig.

17 Claims, 1 Drawing Sheet

U.S. PATENT DOCUMENTS

| | | | |
|---|---|---|---|
| 5,229,336 A * | 7/1993 | Akiyama et al. | 501/56 |
| 5,364,433 A | 11/1994 | Nishimura et al. | |
| 5,766,291 A | 6/1998 | Sato et al. | |
| 5,772,714 A * | 6/1998 | Sato et al. | 65/17.5 |
| 5,977,000 A * | 11/1999 | Sato et al. | 501/39 |
| 2002/0076559 A1 * | 6/2002 | Sato et al. | 428/426 |
| 2003/0115905 A1 * | 6/2003 | Kuhn et al. | 65/17.6 |
| 2005/0217318 A1 | 10/2005 | Kuhn et al. | |

FOREIGN PATENT DOCUMENTS

| | | |
|---|---|---|
| EP | 0546196 A | 6/1993 |
| EP | 0770584 A | 5/1997 |
| EP | 1586544 A | 10/2005 |
| JP | 05139779 A | 6/1993 |
| JP | 10114532 A | 5/1998 |

OTHER PUBLICATIONS

Pfleiderer et al., "The UV-induced 210 nm absorption band in fused silica with different thermal history and stoichiometry," Journal of Non-Cryst. Solids 159 (1993),p. 143-153.

Shelby, "Reaction of hydrogen with hydroxyl-free vitreous silica," J. Appl. Phys., vol. 51, No. 5, May 1980, 2589-2593.

espacenet English language abstract of JP 05139779, Jun. 8, 1993.

espacenet English language abstract of JP 10114532, May 6, 1998.

* cited by examiner

HOLDER MADE FROM QUARTZ GLASS FOR THE PROCESSING OF SEMICONDUCTOR WAFERS AND METHOD FOR PRODUCTION OF THE HOLDER

The present invention relates to a quartz glass jig for processing semiconductor wafers.

Furthermore, the present invention relates to a method for producing such a quartz glass jig.

Yield and electrical operative behavior of semiconductor components essentially depend on the extent to which semiconductor fabrication succeeds in preventing contamination of the semiconductor material caused by impurities acting as "semiconductor poisons". Contamination of the semiconductor material is e.g. caused by the apparatuses used in the fabrication process. On account of the chemical resistance of quartz glass to a great number of substances used in the fabrication process and on account of its relatively high-thermal stability, apparatuses of such types often consist of quartz glass. Therefore, high demands are made on the purity of quartz glass. Therefore, the apparatuses are more and more provided with specifically purified or treated layers, or synthetically produced quartz glass is used that is distinguished by high purity.

A jig of the above-mentioned type is known from JP 10114532 A. The document describes a so-called "single wafer jig" of synthetic quartz glass which is distinguished by a low content of the impurities Fe, Cu, Cr and Ni, each being less than 10 ppb, and by a hydroxyl group content in the range between 100 ppm and 1000 ppm.

In this respect the known quartz glass jig is well suited for use in semiconductor manufacturing processes. In plasma etch processes in which the semiconductor substrates (wafers) are subjected to gases and plasmas having an etching effect, e.g. $CF_4$, $CHF_3$, $C_2F_6$, $C_3F_8$, $NF_3$ or $SF_6$, a further problem is however that the quartz glass is slowly corroded in the process. The surface is removed thereby, which finally results in a loss in volume which calls for a replacement of the quartz glass jig.

An ideal quartz glass for a wafer jig for use in an environment having an etching effect is therefore distinguished by both high purity and high resistance to dry etching. It is the object of the present invention to indicate a quartz glass which substantially fulfills these requirements, and to provide an economic method for producing such a quartz glass.

As for the quartz glass jig, this object, starting from the above-indicated jig, is achieved according to the invention in that the quartz glass is doped with nitrogen at least in a near-surface area, has a mean content of metastable hydroxyl groups of less than 30 wt ppm and that its fictive temperature is below 1250° C. and its viscosity is at least $10^{13}$ dPa·s at a temperature of 1200° C.

The near-surface area is primarily decisive for the dry etching resistance of the quartz glass jig. Therefore, the following explanations will refer to the quartz glass is in a near-surface layer of the jig with a depth of at least 50 μm, the layer encompassing the whole jig, if necessary. The quartz glass has the following three essential features:

the mean content of metastable hydroxyl groups of the quartz glass is less than 30 wt ppm, the fictive temperature of the quartz glass is below 1250° C., and it is distinguished by a high viscosity which is at least $10^{13}$ dPa·s at a temperature of 1200° C.

The impacts of these features on the above-mentioned technical object shall be explained in more detail in the following:

It has been found that the etch behavior of quartz glass is significantly determined by its hydroxyl group content. The lower the content of hydroxyl groups (hereinafter also called "OH groups"), the better is the etch resistance of the quartz glass to fluorine-containing substances. This effect can be explained by the fact that OH groups can be more easily protonized than the Si—O—Si groups of the quartz glass network. In the quartz glass network, OH groups protonized by the acid attack represent start groups that can be easily substituted by a nucleophilic attack of the fluoride anion. This means that the more hydroxyl groups are present in the quartz glass structure, the faster is the decomposition of the quartz glass network. The gross reaction that takes place in the etching process can be described as follows:

$$\text{Si—OH(network)} + \text{HF} \rightarrow \text{Si—(OH}_2)^+ + \text{F}^- \rightarrow \text{Si—F} + \text{H}_2\text{O} \quad (1)$$

The higher etch stability of the quartz glass, however, is only significantly noticed in the case of a hydroxyl group content of less than 30 wt ppm.

The OH group content is composed of chemically firmly bound OH groups which cannot be removed by annealing the quartz glass, and of chemically less firmly bound OH groups which can be "annealed out" of the quartz glass by way of a temperature treatment. The last-mentioned species of OH groups will be called "metastable OH groups" or "metastable hydroxyl groups" in the following.

Within the meaning of this invention the OH group content that will escape after bake-out of a component with a thickness of 10 mm (diffusion length≦5 mm) when the bake-out process takes place at a temperature of 1040° C. for a period of 48 hours and with inert gas purging shall be defined as the content of metastable OH groups.

The content of metastable OH groups follows from the difference of the hydroxyl group content before and after the above-described bake-out, by measurement of the IR absorption according to the method of D. M. Dodd et al. "Optical Determinations of OH in Fused Silica", (1966), page 3911. The content of metastable OH groups will at any rate be smaller than the indicated upper limit if the total hydroxyl group content of the quartz glass is below said upper limit.

Furthermore, it has been found that the etch behavior of quartz glass is essentially determined by its glass structure. A high etch resistance can only be achieved if strained bonds and bonding angles are avoided in the quartz glass network. One parameter for characterizing the specific glass structure is the "fictive temperature". The state of order of the "frozen-in" glass network is described thereby. A higher fictive temperature of the quartz glass is accompanied by a lower state of order of the glass structure and a greater deviation from the energetically most advantageous arrangement. In quartz glass having a fictive temperature above 1300° C., the energetically more disadvantageous state of the glass structure is clearly noticeable in the form of a higher etch rate.

A standard measurement method for determining the fictive temperature by way of a measurement of the Raman scattering intensity at a wave number of about 606 cm$^{-1}$ is described in "Ch. Pfleiderer et al.; The UV-induced 210 nm absorption band in fused silica with different thermal history and stoichiometry; Journal of Non-Cryst. Solids 159 (1993), pp. 143-145".

Moreover, it has been found that the etch resistance of the quartz glass significantly depends on its viscosity. A high viscosity is accompanied by a high etch resistance. Therefore, the quartz glass according to the invention is also distinguished by a high viscosity which is at least $10^{13}$ dPa·s at a temperature of 1200° C.

If used in conformity with its intended purpose, the quartz glass jig will not be subjected to high temperatures near the softening range of quartz glass. The standard temperature loads are between room temperature and about 300° C., so that the thermal stability of the quartz glass plays no essential role in the present invention.

A further essential parameter for the etch resistance of the quartz glass are dopants. It has turned out to be advantageous when the quartz glass is doped with nitrogen at least in a near-surface area.

Figure 2:
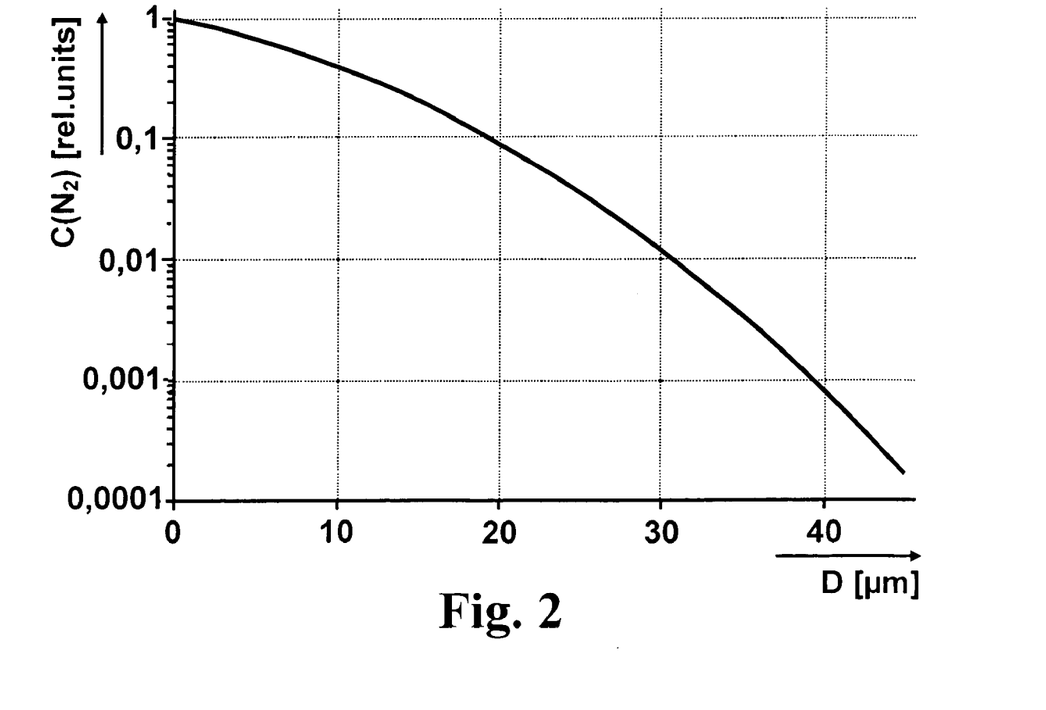
FIG. 2 is a diagram which shows a theoretically determined diffusion profile for the in-diffusion of nitrogen from the surface of a quartz glass jig.

As is generally known, nitrogen doping of the quartz glass will increase viscosity and thus also effect an increased etch resistance. If nitrogen doping of the quartz glass is produced by in-diffusion from a free surface, a specific diffusion of nitrogen will automatically be obtained inside the quartz glass, as is shown in the diagram of FIG. 2. On the basis of the diffusion profile and the initial value directly on the jig surface, it is possible to determine the mean nitrogen content of the quartz glass in the whole surface layer (50 μm). At a nitrogen concentration determined by XPS analysis on the basis of the uppermost 5 nm of the surface, it has turned out to be enough when a nitrogen content of 10 atom % is measured at said place.

Hydrogen-free synthesis methods for producing synthetic quartz glass with an extremely low total content of hydroxyl groups are generally known. Plasma-supported oxidation and deposition of $SiO_2$ in a hydrogen-free atmosphere shall here be mentioned by way of example. Hydroxyl group contents in the ppb range as are required for optical waveguide applications can be attained with such methods. The quartz glass produced in this way is however very expensive and therefore not suited for mass application in semiconductor fabrication.

As a rule, synthetic quartz glass is produced by way of the so-called flame hydrolysis method from silicon-containing start substances by using deposition burners based on oxyhydrogen gas. Large amounts of hydroxyl groups are here introduced into the quartz glass. These groups can subsequently be removed relatively easily in a two-stage process with an intermediate product in the form of a porous $SiO_2$ body (soot body), for instance by a dehydration treatment using halogens.

However, it has now been found that the dehydration of porous $SiO_2$ bodies in halogen-containing atmosphere leads either to weak network bonds or to a low density of the quartz glass, and that both effects are accompanied by a low etch stability of the resulting quartz glass.

On account of the above-mentioned reasons, the quartz glass is molten from naturally occurring $SiO_2$ raw material in a first preferred embodiment of the jig according to the invention, the mean content of metastable hydroxyl groups being less than 5 wt ppm.

The quartz glass is here molten from naturally occurring raw materials. Attention must be paid that in the fabrication process the hydroxyl groups introduced into the quartz glass are as few as possible, or that these can at least be removed later.

Of the above-explained parameters, viscosity and hydroxyl group content have the most pronounced impact on the etch behavior of the quartz glass. Preferably, the mean content of metastable hydroxyl groups of the natural quartz glass is therefore not more than 1 wt ppm.

In a further preferred embodiment of the quartz glass jig according to the invention, the quartz glass is fused from synthetically produced $SiO_2$, with the proviso that it has a mean nitrogen content of at least 0.1 atom %.

Due to the above-mentioned problems arising in the dehydration of synthetic quartz glass using halogens, an extremely small hydroxyl group content may be accompanied by other drawbacks, such as a low density or a high chlorine content. An acceptable etch resistance is however achieved in synthetic quartz glass at any rate if the glass has a mean nitrogen content of at least 0.1 atom %.

Synthetic quartz glass having a low total content of hydroxyl groups is normally produced by the measures that an $SiO_2$ soot body produced by flame hydrolysis of $SiCl_4$ is dehydrated at a temperature of 1200° C. in a chlorine-containing atmosphere and is subsequently vitrified at a high temperature in vacuum to obtain a transparent quartz glass blank.

Chlorine can easily substitute hydroxyl groups in the quartz glass network so that the content thereof can be lowered relatively easily to very small values by this type of dehydration treatment. However, this entails the incorporation of chlorine into the glass network, which has a disadvantageous effect on the dry etching resistance. A similar situation arises in the case of dehydration by means of other halogens or the compounds thereof, particularly by means of fluorine. On the other hand, a purely physical, and not chemically supported, reduction of the hydroxyl group content to values below 50 wt ppm requires long treatment periods at high temperatures. It has been found that rearrangements of the glass structure and defect formations may take place, particularly oxygen defects, one reason for this may be that a suitable substituent is not immediately available for the removed OH groups. The oxygen defects generated in this way are however less harmful to the dry etching resistance of the quartz glass than a high chlorine content.

Therefore, a synthetic quartz glass is preferably produced in that a soot body is thermally dried at a high temperature of about 1200° C. in such a manner that a mean total content of hydroxyl groups of less than 30 wt ppm is obtained. This thermal dehydration treatment prevents an excessive introduction of halogens into the soot body in the course of the substitution of hydroxyl groups. The soot body is subsequently vitrified in the standard way. This leads to an out-diffusion of the existing molecular hydrogen which in the flame hydrolysis method is introduced into the quartz glass due to the production process and would, otherwise, further react in subsequent hot treatment steps to form undesired SiH groups that, in the course of the further treatment steps, would be noticeable in a disadvantageous manner and would lead to a deterioration of the dry etching behavior of the quartz glass. The vacuum serves to accelerate the outgassing process. After vitrification a quartz glass blank is present with a total hydroxyl group content of less than 30 wt ppm, which is substantially free from oxygen defects, SiH groups and hydrogen (the content of all of these components is below the detection limit). The quartz glass blank is subsequently annealed, attention being paid to the setting of a fictive temperature in the range between 1040° C. and 1200° C. The predetermined fictive temperature can be maintained in that the quartz glass blank is held at a temperature in the range of the desired fictive temperature up to the setting of the structural balance and is thereafter cooled rapidly, or in that the blank is cooled fast enough from a temperature above the fictive temperature to be set.

It has turned out to be particularly advantageous when the quartz glass has a content of fluorine of less than 50 wt ppm and a content of chlorine of less than 60 wt ppm.

Fluorine and chlorine doping operations will reduce the density of quartz glass, thereby impairing etch resistance. Moreover, fluorine or chlorine can be easily protonized or substituted in the compounds of silicon, thereby accelerating the decomposition of the network structure. In the case of natural quartz glass, fluorine or chlorine is often quantitatively analyzed by analysis methods such as ICP-AES (inductive coupled plasma atomic (optical) emission spectroscopy) or ICP-AAS (inductive coupled plasma atomic (optical) absorption spectroscopy), the detection limit of fluorine being about 50 wt ppm and that of chlorine about 60 wt ppm. The actual concentrations of said substances in natural quartz glass may, however, be clearly below said detection limits, depending on the pretreatment of the raw material. In synthetic quartz glass, Raman spectroscopy is used for the quantitative analysis of fluorine or chlorine. The contents of said substances are to be quantified in the ppb range by means of Raman spectroscopy.

It has also turned out to be advantageous when the quartz glass has a content of SiH groups below $1 \times 10^{17}$ per $cm^3$ glass.

Defect centers reduce the etch resistance of quartz glass to hydrofluoric acid. In this respect the SiH groups, in particular, have turned out to be especially disadvantageous. Their reaction with hydrofluoric acid can be described with reference to the following reaction equation:

$$Si—H(network)+HF \rightarrow Si—F+H_2 \qquad (2)$$

As an alternative, it is also conceivable that the SiH groups first react with water to form SiOH and that the above-mentioned reaction (1) will then take place. SiH groups are sterically less hindered than SiOH groups with respect to chemical attack and in this respect they are also preferred points of attack of fluorine-containing etchants.

A particularly suitable embodiment of the quartz glass jig of the invention is distinguished in that the quartz glass shows absorption of less than 0.5/cm for UV radiation of a wavelength of 163 nm.

Absorption at this wavelength is due to a defect center of the network structure in the form of an oxygen defect, an Si—Si group. It has been found that such defects also reduce the etch resistance to fluorine-containing etchants.

So-called network converters, such as alkali ions, loosen the network structure of quartz glass already at a low concentration to a considerable extent and reduce the etch resistance thereof. Therefore, it has turned out to be advantageous when the content of Na and K in the quartz glass is not more than 500 wt ppb.

On the other hand, it has turned out to be advantageous when the quartz glass contains aluminum oxide, the Al content ranging from 5,000 wt ppm to 20,000 wt ppm (based on Al, not on $Al_2O_3$).

Doping with aluminum oxide will increase the etch resistance of the quartz glass. However, a high Al content is often also accompanied by a high hydroxyl group content due to the fabrication process because the Al-doped quartz glass is normally molten by flame melting methods using a hydrogen-containing burner flame to avoid separations. Such Al-doped quartz glass having a high hydroxyl group content at the same time falls under a class of material that is not the subject of the present invention.

As for the method, the above-mentioned object is achieved according to the invention by a method comprising the following method steps:

providing $SiO_2$ raw material in particle form, preferably from naturally occurring raw material, melting or sintering the $SiO_2$ raw material to obtain a quartz glass blank, the $SiO_2$ raw material or the quartz glass blank being subjected to a dehydration measure, heating the $SiO_2$ raw material or the quartz glass blank to a nitriding temperature in the range between 1050° C. and 1850° C. in an ammonia-containing atmosphere, a temperature treatment by means of which the quartz glass of the quartz glass blank is set to a fictive temperature of 1250° C. or less, and a surface treatment of the quartz glass blank with formation of the quartz glass jig.

The method according to the invention serves to produce a quartz glass jig of the invention With the above-explained characteristics and effects by using synthetic, preferably natural, raw material.

In the preferred case, a quartz glass blank is first molten from naturally occurring purified raw material. A low content of hydroxyl groups is typical of natural raw material in the form of quartz crystals. Therefore, the selection of this raw material will already yield a comparatively low total content of hydroxyl groups in the quartz glass without the need for a complicated water-free synthesis method or dehydration treatment of a porous soot body with the above-explained consequences of the formation of weak network bonds or a low density of the quartz glass, as is typical of synthetic quartz glass. Nevertheless, the manufacturing method using natural raw material requires a special dehydration measure for achieving a quartz glass having a content of metastable hydroxyl groups of less than 30 wt ppm, preferably less than 5 wt ppm, and particularly preferably less than 1 wt ppm.

For doping the quartz glass with nitrogen, which contributes to an increase in viscosity at high temperatures of application and to an increased etch resistance of the quartz glass, the $SiO_2$ raw material or the quartz glass blank is heated in an ammonia-containing atmosphere.

This accomplishes efficient nitrogen doping of the raw material or at least of the near-surface quartz glass layer of the blank, which contributes to an increase in viscosity at high temperatures of application and to an increased etch resistance of the quartz glass.

At nitriding temperatures below 1050° C., the nitriding rate is comparatively low and limited to a thin surface area.

Furthermore, a temperature treatment is needed for setting the quartz glass of the quartz glass blank to a fictive temperature of 1250° C. or less. A slow cooling of the quartz glass in the temperature range between 1450° C. and 1100° C. is typical of the annealing temperature, thereby permitting structural rearrangements of the glass structure.

A surface treatment of the quartz glass blank is subsequently performed with formation of the quartz glass jig. As a rule, end measure treatment of the blank takes place through mechanical removal. The smoothing operation of the mechanically treated surface can be carried out by chemical etching or by way of a fire polish. Surface treatment may also comprise a heating of the blank in an ammonia-containing atmosphere.

The further processing of the blank to obtain the quartz glass jig of the invention comprises a surface treatment, for instance a mechanical, thermal or chemical aftertreatment of the blank by doping, vitrifying, grinding, cutting or polishing, also flame polishing. Moreover, the further processing may include an annealing step or plastic forming steps.

It has turned out to be advantageous when the nitriding temperature during heating of the $SiO_2$ raw material or the quartz glass blank is not more than 1250° C.

At temperatures above 1250° C., the decomposition of ammonia and the presence of hydrogen lead to a significant incorporation of hydroxyl groups, which results in a decrease in the etch resistance of the quartz glass. In view of these opposite effects an optimum etch resistance is achieved in a quartz glass of natural raw materials at a nitriding temperature ranging from 1080° C. to 1120° C. and in synthetic quartz glass at a nitriding temperature ranging from 1130° C. to 1170° C.

It has turned out to be advantageous when the dehydration measure includes a melting or sintering of the $SiO_2$ raw material in a graphite-containing mold.

The carbon of the graphite-containing mold has a dehydrating impact on quartz glass and therefore removes hydroxyl groups very efficiently. A dehydration measure comprising a melting or sintering of the $SiO_2$ raw material in a water-free atmosphere or in vacuum has an equal impact.

A dehydration measure comprising annealing of the quartz glass blank in vacuum has an equally advantageous impact.

Metastable OH groups that are present in the surface area of the quartz glass blank are removed by annealing the blank at temperatures of more than 1000° C. (strictly speaking 1040° C.) and for a period of several hours.

A preferred variant in which the dehydration measure comprises heating of the $SiO_2$ raw material or the quartz glass blank to the nitriding temperature in an ammonia atmosphere has a similar effect.

Apart from dehydration by elimination of metastable OH groups, a desired loading of the quartz glass with nitrogen is accomplished at the same time.

A further improvement is achieved when the surface treatment comprises heating of the blank surface, using a laser beam locally acting on the surface or high-temperature plasma.

Due to local heating to a high temperature using a laser or a plasma device the near-surface quartz glass is locally fused, so that existing microcracks are eliminated and a smooth fire-polished surface is obtained that during the intended use of the quartz glass jig discharges few particles to the environment. Since only local areas of the surface are heated and softened, only low mechanical stresses are introduced into the jig by the treatment, the stresses being neither noticeable in a change in the fictive temperature nor effecting any deformations of the jig. It is here particularly advantageous with respect to a low hydroxyl group content and a high etch resistance when the treatment is carried out with exclusion of water and hydrogen, so that the incorporation of hydroxyl groups into the fused quartz glass is prevented.

Moreover, an improved etch resistance of the quartz glass jig is achieved if the surface treatment comprises a mechanical surface treatment, whereby an initial mean surface roughness $R_{a,0}$ of 0.2 μm or more is set, and wherein in a subsequent etching treatment at least 10 μm are removed from the surface obtained by mechanical treatment.

It is solely by way of this measure, which is explained in more detail in DE 10 2005 005 196.0, and which is herewith explicitly included in the present application, that a considerable improvement of the etch resistance of the jig is achieved. The quartz glass surface pretreated in this way is particularly well suited for taking the above-explained measures, such as doping with nitrogen.

The invention shall now be explained in more detail with reference to an embodiment and a patent drawing where, in detail.

Figure 1:
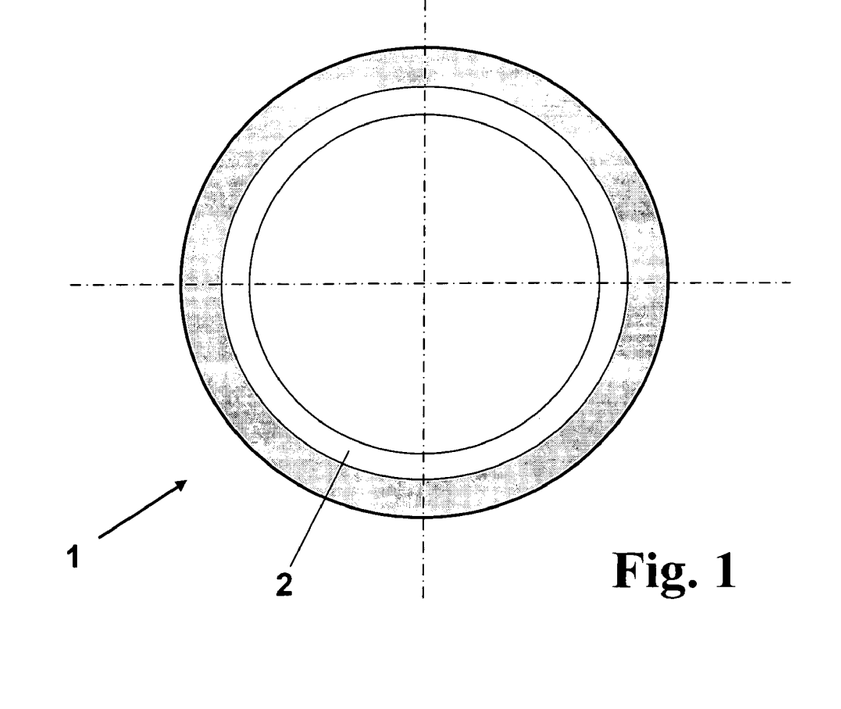
FIG. 1 is a schematic illustration showing an embodiment of the quartz glass jig of the invention for use as a single-wafer jig in semiconductor fabrication.

FIG. 1 shows a single-wafer jig 1 of quartz glass for processing 8-inch wafers. The jig 1 consists essentially of a quartz glass ring having an outer diameter of 256 mm and an inner diameter of 196 mm, which is provided with a surrounding hollow 2 for receiving the wafer.

In all subsequent examples, a quartz glass jig will each time be started from, where the two flat sides and the cylinder surfaces are ground, with the mean surface roughness ($R_a$ value) being 0.8 μm.

The samples were subjected to various aftertreatment operations to improve the jig on the whole or specifically its surface with respect to dry etching resistance. The aftertreatment operations are shown for each sample in Table 1. The viscosity data in the table refer to a temperature of 1200° C. and to nitrogen-doped quartz glass in case the sample in question is doped with nitrogen. As for nitrogen doping, a distinction is made between doping of the near-surface area, the nitrogen contents as determined by means of XPS measurement being indicated in the penultimate line of Table 1, and doping of the whole volume (only sample S4). The aftertreatment processes shall be explained in more detail in the following:

Long-Lasting Wet Etching in HF Solution

After grinding the quartz glass jig is treated in 10% HF solution for 1440 minutes, resulting in an etch structure having a mean surface roughness $R_a$ of about 4.3 μm, which is entirely free from microcracks. During further etching in 10% hydrofluoric acid a typical feature of the quartz glass jig produced in this way is a weight reduction which in comparison with untreated quartz glass is considerably smaller and approximately constant in time.

Hydroxyl Group-Free Smoothing by Laser Polish

Instead of an etch treatment in hydrofluoric acid, the jig 1 is vitrified in a hydrogen-free atmosphere after grinding by means of a $CO_2$ laser. In this process the laser beam is expanded by means of an optical system and moved along the quartz glass surface. The surface is locally heated and softened in this process, and a flame-polished surface is obtained without any additional incorporation of hydroxyl groups.

Nitrogen Doping of the Surface

The quartz glass jig is treated at a temperature of 1100° C. in an ammonia atmosphere for a period of 2 hours. This results in nitrogen loading in the near-surface area, which is quantified by an XPS measurement. Each of the nitrogen contents indicated in Table 1 refers to a near-surface layer thickness area of 5 nm to 10 nm. The nitrogen concentration profile can be determined therefrom on the basis of FIG. 2 through the layer thickness. Table 1 refers to optionally conducted nitrogen loading in the near-surface area in the penultimate line, the figure behind the slash designating the nitrogen concentration on the surface as determined by XPS analysis.

Determination of the Dry Etching Behavior

The dry etching behavior was determined for all quartz glass samples indicated in Table 1. To this end corresponding samples were subjected in a plasma etch chamber together with a reference sample to a standard etching process. The reference sample is thermally grown $SiO_2$ which evolves in the dry etching processes due to deposition of silicon and subsequent oxidation into silicon dioxide. For determining an etch depth an area of the sample was each time covered with an etch-resistant film. The dry etching behavior is here defined as the ratio of the depths of the etch steps obtained after the etching process in the sample and in the reference sample. The absolute measure determined in this way was again related with the measured value showing the dry etching behavior of the former standard material. This standard material consists of quartz glass of natural raw material which is produced in a multi-stage process comprising the pulling of a quartz glass strand from the melt and several forming processes. In Table 1, which is shown below, a similar quartz glass is designated as sample "N8", where the quartz glass of sample N8, in addition to the standard material, has been subjected to an annealing treatment for setting a low fictive temperature for improving the dry etching resistance and to a special surface smoothing operation and, moreover, has been doped with nitrogen in the near-surface area.

The measured value determined in this way for the dry etching behavior of the respective quartz glass samples is indicated in the last line of Table 1. The smaller the measured value the better is the dry etching behavior of the respective quartz glass. Table 1 also shows the respective chemical composition of the quartz glasses and their specific treatments and the resulting changes in the measured value.

EXAMPLE 1

Sample N1

A quartz glass jig 1 of naturally occurring particulate quartz is molten and ground as explained above.

Naturally occurring particulate quartz crystal is used as the starting material and purified by hot chlorination at a high temperature (about 1050° C.).

The $SiO_2$ granules are subsequently put into a graphite mold and vitrified at a temperature of 1800° C. by gas pressure sintering. The mold is first heated to the sintering temperature of 1800° C. while maintaining a negative pressure of <1 mbar. After the sintering temperature has been reached, an overpressure of 10 bar is set in the furnace and the mold is kept at this temperature for about 3 hours.

Subsequent cooling to a temperature of 400° C. is carried out at a cooling rate of 2° C./min, with the overpressure being upheld. Free cooling to room temperature is then carried out. This manufacturing method is called "vacuum melting" in Table 1.

A hollow cylinder of transparent quartz glass is obtained with the properties specified in Table 1 under N1. For producing a quartz glass jig within the meaning of the present invention a ring is separated therefrom and ground, as has been described at the outset, and is then subjected to a long-lasting wet etching process in HF solution.

The resulting quartz glass is distinguished by a comparatively high dry etching resistance that prior to the etching process in 10% HF solution according to the above-described method is distinguished by a measured value of 0.74 and after the etching process by a measured value of 0.59.

EXAMPLE 2

Sample N1

The quartz glass jig 1 according to Example 1 is additionally subjected to nitrogen doping of the surface after the etching treatment. The XPS measurement reveals a nitrogen concentration of 19 atom % in a near-surface layer thickness area of 5 nm to 10 nm.

This doping operation can further improve the dry etching resistance of the quartz glass in comparison with Example 1, so that a measured value of 0.33 is obtained.

EXAMPLE 3

Sample N2

A quartz glass jig 1 as described with reference to Example 1 is produced. Sample N2 differs from sample N1 just by a slightly higher hydroxyl group content which is due to a slightly less intensive dehydration treatment. As a consequence, a higher viscosity is also achieved in the quartz glass of sample N2, but also a slightly lower fictive temperature.

Instead of the etching treatment in hydrofluoric acid, the jig 1 is subjected after grinding to a hydroxyl group-free smoothing operation by laser polishing, resulting in a flame-polished surface without additional incorporation of hydroxyl groups.

The quartz glass jig treated in this way shows a dry etching behavior that is characterized by a measured value of 0.67. Subsequent nitrogen doping of the surface by treatment in ammonia atmosphere, which yielded a nitrogen concentration of 21 atom % on the basis of an XPS measurement in a near-surface layer thickness area of 5 nm to 10 nm, can further reduce the measured value to 0.37.

EXAMPLE 4

Sample N6: Comparative Example

A quartz glass of natural raw material is produced. Powder-like $Al_2O_3$ is added to the quartz crystal. The powder mixture is molten in a Verneuil method using a hydrogen-containing burner flame to obtain a quartz glass rod, and said rod is then formed into a quartz glass ring by way of several forming steps.

The amount of $Al_2O_3$ powder is dimensioned such that an Al content of 5000 wt ppm is obtained in the molten quartz glass. The hydroxyl group content of the quartz glass at 145 wt ppm is however high due to the manufacturing process.

Nevertheless, the quartz glass shows a very high dry etching resistance which, however, is exclusively due to the very high Al content. Depending on the intended use of the quartz glass jig 1, however, the high Al content may have a disadvantageous effect on the semiconductor fabrication process.

This applies in a similar way to sample N5 with an even higher Al content.

The quartz glass samples N3 and N4 are produced according to the same melting method as samples N5 and N6, but they differ therefrom by a considerable lower Al content and from each other by different measures for the aftertreatment of the surface. The values measured thereupon with respect to the dry etching resistance can be inferred from the table.

EXAMPLE 5

Sample N8

The quartz glass of sample N8 is obtained in that natural raw material is pulled in a crucible pulling method into a strand, and said strand is formed in several method steps into the quartz glass jig and is subsequently mechanically treated to an end measure, as explained above with reference to Example 1.

The quartz glass obtained in this way corresponds to the former standard material for the fabrication of wafer jigs and thus shows a measured value of 1 for its dry etching behavior.

After the surface has been smoothed by a long-lasting etching process in HF solution, the surface is doped with nitrogen under the action of a high-temperature plasma in ammonia. The plasma is excited by microwave excitation at a frequency of 2.45 GHz at a power of 1000 Watt. The surface is here rotated under the plasma zone and shifted, resulting in spiral rasterization above the planar surface. The quartz glass surface is here locally heated and softened. At the same time the ammonia gas is decomposed in the plasma, and nitrogen is incorporated into the quartz glass of the near-surface layer. XPS measurement shows a nitrogen concentration of 23 atom % in a near-surface layer thickness area of 5 nm to 10 nm.

The quartz glass jig 1 treated in this way is characterized by a very high dry etching stability with a measured value of 0.86.

Sample N7 differs in its material composition from sample N8 particularly in the hydroxyl group content. Said quartz glass is made from natural quartz by arc melting in a coarse vacuum. To this end the quartz granules are fixed to the inner wall of a melting mold rotating about its longitudinal axis and are fused by means of an arc ignited in the interior. The tube obtained in this way is further processed by being formed in several method steps and is subjected to a final mechanical finishing operation, as has been explained above with reference to Example 1.

EXAMPLE 6

Sample S4

A quartz glass jig 1 is made from synthetic $SiO_2$ in that a porous $SiO_2$ soot body is produced with the help of the known OVD method by flame hydrolysis of $SiCl_4$. Said soot body is subjected to a dehydration treatment in a chlorine-containing atmosphere. The soot body is vitrified in ammonia, as has been explained in more detail in DE 695 29 824 T2. After vitrification a tubular quartz glass body is obtained with a hydroxyl group content of less than 1 wt ppm and a mean nitrogen content of 0.4 atom %. For producing a quartz glass jig within the meaning of the present invention a ring is separated from the quartz glass tube.

For setting a fictive temperature of about 1065° C. the jig is subjected to an annealing treatment which comprises a hold time of 4 hours at a temperature of 1060° C. and a subsequent slow cooling from said temperature to 400° C. The quartz glass jig 1 is distinguished by a high dry etching resistance (measured value=0.88) which can be improved by a subsequent smoothing of the surface by means of a laser to a measured value of 0.66 and by an additional nitrogen doping of the near-surface area to 0.58.

Samples S2 and S3, which are mentioned in Table 1, are also made from synthetic quartz glass, the respective hydroxyl group contents differing from one another because of differently intensive dehydration treatments and the respective fictive temperature because of different annealing treatments.

EXAMPLE 7

Sample S3

The quartz glass of sample S3 is a synthetic quartz glass which is distinguished by a low hydroxyl group content of 28 wt ppm and low halogen contents. In combination with a hydroxyl group-free, laser-supported smoothing of the surface with nitrogen doping, the quartz glass shows a viscosity of 1×0134 dPa·s at a temperature of 1200° C. and thus at the same time also a high dry etching resistance with a measured value of 0.37.

EXAMPLE 8

Sample S2

The quartz glass of sample S2 is also synthetic quartz glass. This quartz glass is distinguished by a glass structure without oxygen defects, a mean content of SiH groups of less than $5\times10^{16}$ molecules/cm$^3$, a mean content of hydroxyl groups of 5 wt ppm, a mean content of fluorine of 5 wt ppm, a mean content of chlorine of less than 1 wt ppm, and a fictive temperature of 1080° C. The viscosity of the quartz glass and further properties can be seen in Table 1.

A glass structure that is substantially free from oxygen defects is here understood to be a glass structure in which the concentration of oxygen deficient defects is below the detection limit of the Shelby method (minimum about $10^{17}$ per gram quartz glass) This detection method is published in "Reaction of hydrogen with hydroxyl-free vitreous silica" (J. Appl. Phys., Vol. 51, No. 5 (May 1980), pp. 2589-2593).

The content of SiH groups is determined by means of Raman spectroscopy, a calibration being carried out on the basis of a chemical reaction: Si—O—Si+$H_2$→Si—H+Si—OH, as described in Shelby "Reaction of hydrogen with hydroxyl-free vitreous silica" (J. Appl. Phys., Vol. 51, No. 5 (May 1980), pp. 2589-2593).

The synthetic quartz glass of sample S2 is produced in that a soot body is made by flame hydrolysis of $SiCl_4$ with the help of the known VAD method. The soot body is dehydrated at a temperature of 1200° C. in a heating furnace with a heating element of graphite in vacuum, so that a hydroxyl group content of the soot body of about 5 wt ppm is obtained. The dried soot body is then introduced into a sintering furnace and vitrified at a temperature of about 1750° C. in vacuum ($10^{-2}$ mbar) to obtain a transparent quartz glass blank. Said blank is subsequently homogenized by thermally mechanical homogenization (twisting) and formation of a quartz glass cylinder. Thereafter the hydroxyl group content of the quartz glass cylinder is still about 5 wt ppm.

EXAMPLE 9

Comparative Example; Sample S1

In sample S1, the synthetic quartz glass is produced by so-called "direct vitrification". The hydroxyl group content is here so high that even a subsequent nitrogen doping treatment of the surface was not sufficient for increasing the viscosity of the quartz glass at 1200° C. above a value of $1\times10^{13}$ dP·s, so that the dry etching resistance of said quartz glass could also not be improved by comparison with the standard material (measured value=1.08).

FIG. 2 shows a diffusion profile calculated on the basis of the diffusion coefficient for the in-diffusion of nitrogen from the surface of a quartz glass jig. The nitrogen concentration $C(N_2)$ is plotted on the y-axis in relative units—the local nitrogen concentration in depth "D" based on the nitrogen concentration directly on the surface—and the depth "D" measured from the surface in μm on the x-axis. At the known concentration value in the area of the surface, the local concentration is obtained on the basis of the concentration profile in the area of the near-surface layer up to a depth of about 50 μm.

TABLE 1

| Properties | S1 | S2 | S3 | S4 | N1 | N2 | N3 | N4 | N5 | N6 | N7 | N8 |
|---|---|---|---|---|---|---|---|---|---|---|---|---|
| Quality: syn./nat. | synthet. | synthet. | synthet. | synthet. | natural | natural | natural | natural | natural | natural | natural | natural |
| Manufacturing method | DQ method | Soot method 1 | Soot method 2 | Soot method 3 | Vacuum melt. | Vacuum melt | Flame melting | Flame melting | Flame melting | Flame melting | Electr. arc | Multi-stage method |
| Mean OH content [wt. ppm] | 1200 | 5 | 28 | <1 | <1 | 4 | 160 | 156 | 150 | 145 | 9 | 25 |
| Mean F content [wt. ppm] | 1230 | 5 | 40 | <0.5 | <50 | <50 | <50 | <50 | <50 | <50 | <50 | <50 |
| Mean Cl content [wt. ppm] | 20 | <1 | 20 | 1500 | <60 | <60 | <60 | <60 | <60 | <60 | <60 | <60 |
| SiH groups [1/cm3] | 6.9E18 | <1E17 | <1E17 | <1E17 | <1E17 | <1E17 | 2.2E18 | 2.2E18 | <1E17 | <1E17 | 2.7E17 | <1E17 |
| Si—Si groups [@163 nm, 1/cm] | 0.65 | <0.5 | <0.5 | <0.5 | <0.5 | <0.5 | <0.5 | <0.5 | <0.5 | <0.5 | <0.5 | <0.5 |
| Na/K content [wt. ppm] | 0.01/0.02 | 0.01/0.01 | 0.01/0.01 | 0.01/0.01 | 0.05/0.08 | 0.05/0.1 | 0.05/0.2 | 0.04/0.7 | 0.01/0.01 | 0.01/0.01 | 0.1/0.15 | 0.02/0.1 |
| Al content [wt. ppm] | <0.05 | <0.05 | <0.05 | <0.05 | 15 | 15 | 8 | 16 | 15000 | 5000 | 18 | 15 |
| Mean nitrogen content [at. %] | — | — | — | 0.4 | — | — | — | — | — | — | — | — |
| Viscosity [dPas] possibly after N doping | 1E10.8 | 1E12.0 | 1E13.4 | 1E13.1 | 1E13.6 | 1E13.6 | 1E11.8 | 1E13.2 | 1E10.3 | 1E10.8 | 1E13.4 | 1E13.5 |
| Fictive temperature [degree C.] | 1290 | 1080 | 1142 | 1065 | 1170 | 1160 | 1369 | 1283 | 1190 | 1220 | 1240 | 1148 |
| Measured value for dry etching behavior | 1.19 | 0.85 | 0.89 | 0.88 | 0.74 | 0.82 | 1.06 | 0.96 | 0.28 | 0.51 | 0.87 | 1.00 |
| +Etching 1440 min | — | 0.69 | — | — | 0.59 | — | 0.85 | 0.77 | — | — | 0.70 | 0.80 |
| +Laser Smoothing | 1.08 | — | 0.67 | 0.66 | — | 0.67 | — | — | — | — | — | — |
| +Nitrogen Doping N$_2$-content [at-%] (XPS) | | 0.37/26 | | 0.33/20 | 0.37/21 | | 0.64/26 | | | 0.38/26 | 0.56/23 | |
| Final Result | 1.08 | 0.69 | 0.37 | 0.66 | 0.33 | 0.37 | 0.85 | 0.64 | 0.28 | 0.51 | 0.38 | 0.56 |

The invention claimed is:

1. A quartz glass jig for processing semiconductor wafers comprising: quartz glass doped with nitrogen at least in a near-surface area having a depth of at least 50 μm, the quartz glass having a mean content of metastable hydroxyl groups of less than 30 wt ppm and a fictive temperature below 1250° C. and a viscosity of at least $10^{13}$ dPa·s at a temperature of 1200° C.; and wherein the quartz glass has absorption of less than 0.5/cm for UV radiation of a wavelength of 163 nm.

2. The jig according to claim 1, wherein the quartz glass is molten from naturally occurring SiO$_2$ raw material and the mean content of metastable hydroxyl groups is less than 5 wt ppm.

3. The jig according to claim 1, wherein the mean content of metastable hydroxyl groups is not more than 1 wt ppm.

4. The jig according to claim 1, wherein the quartz glass is molten from synthetically produced SiO$_2$ and has a mean nitrogen content of at least 0.1 atom %.

5. The jig according to claim 1, wherein the quartz glass has a content of fluorine of less than 50 wt ppm.

6. The jig according to claim 1, wherein the quartz glass has a content of chlorine of less than 60 wt ppm.

7. The jig according to claim 1, wherein the quartz glass has a content of SiH groups below $1 \times 10^{17}$ per cm$^3$ glass.

8. The jig according to claim 1, wherein any Na and K present in the quartz glass is less than 500 wt ppb.

9. The jig according to claim 1, wherein the quartz glass contains aluminum oxide at least in the near-surface area, and an Al content ranges from 5,000 wt ppm to 20,000 wt ppm.

10. A method for producing a quartz glass jig for use in semiconductor production, said method comprising:
providing SiO$_2$ raw material in particle form,
melting or sintering the SiO$_2$ raw material to obtain a quartz glass blank, the SiO$_2$ raw material or the quartz glass blank being subjected to a dehydration measure,
heating the SiO$_2$ raw material or the quartz glass blank to a nitriding temperature in a range between 1050° C. and 1850° C. in an ammonia-containing atmosphere,
performing a temperature treatment by means of which the quartz glass of the quartz glass blank is set to a fictive temperature of 1250° C. or less,
performing a surface treatment of the quartz glass blank so as to form the quartz glass jig, and
wherein the surface treatment comprises a mechanical surface treatment, in which an initial mean surface roughness $R_{a,0}$ of 0.2 µm or more is set, and wherein, in a subsequent etching treatment, at least 10 µm are removed from the surface obtained by the mechanical surface treatment.

11. The method according to claim 10, wherein the nitriding temperature during heating of the $SiO_2$ raw material or the quartz glass blank is not more than 1250° C.

12. The method according to claim 10, wherein the dehydration measure comprises melting or sintering of the $SiO_2$ raw material in a graphite-containing mold.

13. The method according to claim 10, wherein the dehydration measure comprises melting or sintering of the $SiO_2$ raw material in a water-free atmosphere or in vacuum.

14. The method according to claim 10, wherein the dehydration measure comprises annealing of the quartz glass blank in vacuum.

15. The method according to claim 10, wherein the dehydration measure comprises heating the $SiO_2$ raw material or the quartz glass blank to the nitriding temperature in the ammonia atmosphere.

16. The method according to claim 10, wherein the surface treatment comprises heating the blank surface, using a laser beam locally acting on the blank surface or high-temperature plasma.

17. The method according to claim 10, wherein the $SiO_2$ raw material is from naturally occurring raw material.

* * * * *